United States Patent
Chae et al.

(10) Patent No.: US 8,390,494 B2
(45) Date of Patent: Mar. 5, 2013

(54) SECOND ORDER NOISE COUPLING WITH ZERO OPTIMIZATION MODULATOR AND METHOD

(75) Inventors: Jeong Seok Chae, Corvallis, OR (US); Sang Hyeon Lee, Corvallis, OR (US); Gábor C. Temes, Corvallis, OR (US)

(73) Assignee: Asahi Kasei Microdevices Corporation, Tokyo (JP)

( * ) Notice: Subject to any disclaimer, the term of this patent is extended or adjusted under 35 U.S.C. 154(b) by 153 days.

(21) Appl. No.: 13/006,637

(22) Filed: Jan. 14, 2011

(65) Prior Publication Data

US 2011/0175762 A1 Jul. 21, 2011

Related U.S. Application Data

(60) Provisional application No. 61/295,197, filed on Jan. 15, 2010.

(51) Int. Cl.
*H03M 3/00* (2006.01)
(52) U.S. Cl. ......... 341/143; 341/118; 341/120; 341/155
(58) Field of Classification Search .................. 341/118, 341/120, 143
See application file for complete search history.

(56) References Cited

U.S. PATENT DOCUMENTS

| | | | | |
|---|---|---|---|---|
| 5,442,353 A | * | 8/1995 | Jackson | 341/143 |
| 5,784,017 A | * | 7/1998 | Craven | 341/126 |
| 6,005,505 A | * | 12/1999 | Linz | 341/143 |
| 7,928,876 B2 | * | 4/2011 | Thomsen et al. | 341/143 |
| 7,973,689 B2 | * | 7/2011 | Glass et al. | 341/143 |
| 7,999,711 B1 | * | 8/2011 | He et al. | 341/143 |
| 8,049,651 B2 | * | 11/2011 | Nakamoto | 341/143 |
| 8,212,702 B2 | * | 7/2012 | Lin et al. | 341/143 |
| 2002/0196169 A1 | * | 12/2002 | Okuda et al. | 341/143 |
| 2005/0088328 A1 | * | 4/2005 | Kawamura | 341/143 |
| 2006/0044166 A1 | * | 3/2006 | Pfister et al. | 341/143 |
| 2008/0136693 A1 | * | 6/2008 | Kim et al. | 341/143 |
| 2008/0143568 A1 | * | 6/2008 | Zhixu et al. | 341/143 |
| 2010/0214143 A1 | * | 8/2010 | Nakamoto | 341/143 |

OTHER PUBLICATIONS

Chae, J. et al., "A 63 dB 16 mW 20 MHz BW Double-Sampled ΔΣ Analog-to-Digital Converter with an Embedded-Adder Quantizer", IEEE, 2010, 4 pgs.
Schinkel, D. et al., "A Double-Tail Latch-Type Voltage Sense Amplifier with 18ps Setup+Hold Time", IEEE International Solid-State Circuits Conference, 2007, 3 pgs.
Schinkel, D. et al., "A Low-Offset Double-Tail Latch-Type Voltage Sense Amplifier", ProRISC 2007, 18th Annual Workshop on Circuits, Systems and Signal Processing, Nov. 29-30, 2007, 6 pages, Veldhoven, the Netherlands.
Silva, J. et al., "Wideband Low-Distortion Delta-Sigma ADC Topology", Electronic Letters, Jun. 7, 2001, pp. 737-738, vol. 37, No. 12.
Vleugels, K. et al. "A 2.5-V Sigma-Delta Modulator for Broadband Communications Applications", IEEE J. Solid-State Circuits, 2001, pp. 1887-1899, vol. 36, No. 12.

(Continued)

*Primary Examiner* — Linh Nguyen
(74) *Attorney, Agent, or Firm* — Maine Cernota & Rardin (57) ABSTRACT

A method and apparatus for a modified noise-coupled modulator using zero optimization technique is disclosed. By realizing the resonator coefficient as a part of branches other than those of the main transfer function, the problem of improving SQNR without degrading other specifications is solved. Second order noise coupling is used to implement zeros without using feedback branches going into the first integrator. Embodiments use a first-order modulator, second-order noise coupling and a resonator. It allows lower power consumption and smaller size by removing small capacitor values and gain factors and reducing the number of amplifiers.

18 Claims, 7 Drawing Sheets

OTHER PUBLICATIONS

Zhang, Z. et al., "A Segmented Data-Weighted-Averaging Technique", IEEE Int. Symposium Circuits and Systems, May 2007, pp. 481-484, New Orleans.

Lee, K. et al., "A Noise-Coupled Time-Interleaved Delta-Sigma ADC with 4.2 MHz Bandwidth, -98 dB THD, and 79 dB SNDR", IEEE Journal of Solid-State Circuits, Dec. 2008, pp. 2601-2612, vol. 43, No. 12.

Lee, K. et al., "Noise-Coupled ΔΣ ADCs", Electronics Letters, Nov. 23, 2006, 2 pgs., vol. 42, No. 24.

* cited by examiner

SECOND ORDER NOISE COUPLING WITH ZERO OPTIMIZATION MODULATOR AND METHOD

RELATED APPLICATIONS

This application claims the benefit of U.S. Provisional Application No. 61/295,197 filed Jan. 15, 2010. This application is herein incorporated by reference in its entirety for all purposes.

FIELD OF THE INVENTION

The invention relates to modulators including delta-sigma modulators and, more particularly, to a delta-sigma modulator and method with second order noise coupling including zero optimization.

BACKGROUND OF THE INVENTION

As electronics miniaturization, power consumption, and performance demands increase, the need for smaller, more efficient, digital to analog and analog to digital converters increases. Some applications include high fidelity audio, RF transmitters and receivers, frequency synthesizers, switched-mode power supplies and motor controls. Delta-sigma ($\Delta\Sigma$) modulator analog to digital converters (ADCs) are employed in these data conversion applications. ADC circuits implementing $\Delta\Sigma$ modulation can achieve very high resolutions while using low-cost CMOS processes. The field of signal processing generally is demanding enhanced specifications including cost, complexity, power, speed, signal bandwidth, stability, oversampling ratio (OSR), output signal duty ratio, and signal to noise ratio (SNR). A notable measure is the signal-to-quantization-noise ratio (SQNR). SQNR represents the effect of quantization errors introduced by analog to digital conversion operations. A 6 dB improvement in the SQNR corresponds approximately to a one bit increase in resolution. Therefore, to achieve the higher resolutions required by today's applications, SQNR improvements are needed.

Delta-sigma modulators can control their SQNR in three ways. These methods include selecting appropriate values for 1) oversampling ratio, 2) modulator order, and 3) quantizer resolution. Higher performance is possible by increasing these values, but there are negative consequences. For example, increasing these values can require an increase the clock frequency and/or the number of devices, leading to greater power consumption and larger device size. While doubling the OSR can increase the SQNR for a second-order modulator, this places limitations on the input bandwidth. Increasing the modulator order has consequences of increased instability. Increasing quantizer resolution leads to a large die area and increased power consumption.

Figure 1:
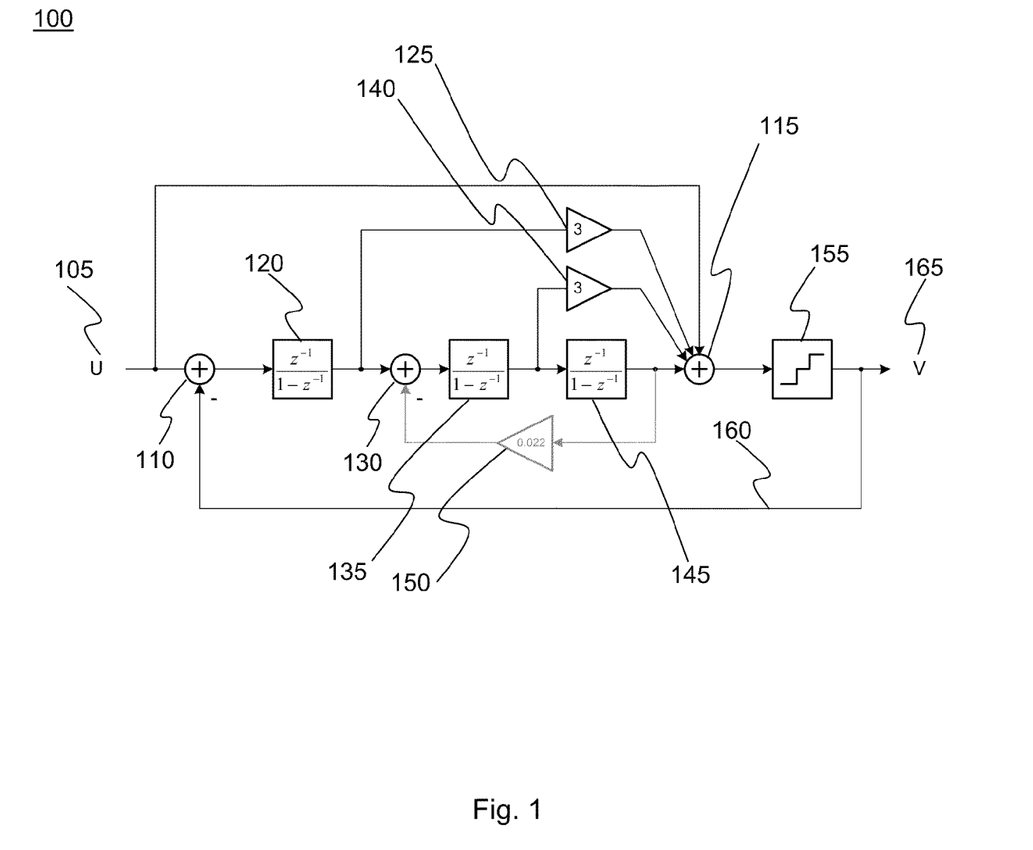
FIG. 1 is a block diagram of a prior art third-order modulator with zero optimization depicting a small resonator coefficient.

While zero optimization can increase $\Delta\Sigma$ modulator SQNR, especially for low OSR and high modulator orders, it too has negative consequences. With zero optimization, the zeros of the noise transfer function (NTF) can be placed at optimal frequencies for SQNR improvement. However, for high OSR, this technique results in very small values for the resonator coefficients. For example, a third-order prior art modulator shown in FIG. 1 with an OSR of 16 requires a coefficient of 0.022. FIG. 1 is a block diagram 100 of a prior art third-order modulator with zero optimization. Input U 105 is applied to summing nodes 110 and 115. Output of summing node 110 is applied to input of integrator 120. Output of integrator 120 is applied to input of feedforward path 125 and input of summing node 130. Output of summing node 130 is applied to input of integrator 135. Output of integrator 135 is applied to input of feedforward path 140 and input of integrator 145. Output of integrator 145 is applied to input of feedback path 150, whose output is applied to summing node 130. Output of integrator 145 is also applied to summing node 115, whose output is applied to quantizer 155. Quantizer output is returned to summing node 110 by digital output feedback path 160 and also provides output V 165.

The implementation of this small resonator coefficient value requires additional power consumption and larger die area, compared with the case without zero optimization. It can also be a cause of a high noise floor for the entire system. This might be solved by using a bigger capacitance or T-network, but either of these requires more power than the original modulator to reduce the noise floor. Generally, capacitors are scaled down from the first integrator (which is connected to the input signal) to the following integrators to save power. However, with zero optimization it is difficult to scale down the integrator capacitors while providing a small resonator feedback coefficient through one of the input branches. This is because the minimum allowable capacitance is decided by the fabrication process.

Generally, noise coupling is a technique to increase the order of modulators by adding and/or subtracting delayed quantization noise which allows better shaping of the quantization noise. Noise-coupled modulators can realize NTF zeros when implemented with the main modulator. However, for the main modulator, if a first-order modulator is used, only one zero can be moved. Hence, the SQNR improvement is not large compared with instead using a higher modulator order. Even with a second-order modulator, putting optimized zeros into the main transfer function is difficult because it requires a capacitance which is of the order of a few femtofarads. Additionally, the power consumption of the integrator (which has as one of its inputs the resonator feedback) is affected by this coefficient. Consequences are that a larger area and greater power consumption are required when increasing the capacitor sizes to obtain accurate capacitors.

What is needed are techniques for improving SQNR performance without degrading size, power consumption, stability, or bandwidth.

SUMMARY OF THE INVENTION

A method and apparatus for a modified noise-coupled modulator using a zero optimization technique is disclosed. It has enhanced specifications that meet the demands of signal processing. By realizing the resonator coefficient as a part of branches other than those of the main transfer function, the problem of improving SQNR without degrading other specifications is solved. Second order noise coupling is used to implement zeros without using feedback branches going into the first integrator. Embodiments use a first-order modulator, second-order noise coupling and a resonator. This allows lower power consumption and smaller size by removing the small capacitors and gain factors and reducing the number of amplifiers. MATLAB® simulations verify that embodiment performance exhibits second-order enhancement and signal-to-quantization-noise ratio (SQNR) improvement. MATLAB® is a registered trademark of The MathWorks™, Inc.

Embodiments provide a modulator system comprising an integrator receiving an input signal summed with a feedback signal; an analog noise coupling branch receiving input from the integrator, the input signal, and a digital noise coupling branch; and a quantizer receiving input from the analog noise coupling branch, wherein output of the quantizer is applied to the digital noise coupling branch, and wherein resonator coefficient path is in parallel with feedback branches. Further embodiments provide a method for performing a delta sigma conversion comprising the steps of a first summing of a received signal and a first feedback signal; a first integrating of output of the first summing, producing a first integrated signal; a second summing of the received signal, the first integrated signal, and a digital path signal; processing output of the second summing in an analog path, the analog path comprising feedback; and quantizing output of the analog path, wherein output of the quantizing is applied to the digital path, the digital feedback path comprising feedback, wherein output of the quantizing is the first feedback signal, and wherein output of the quantizing is the converted output signal of the received signal.

An embodiment includes a modulator system comprising an integrator receiving an input signal summed with a first feedback signal; a quantizer receiving the input signal summed with an integrator output signal from the integrator, the quantizer outputting the first feedback signal to input of the integrator; a noise coupling branch feeding back a quantization noise between input and output of the quantizer, the noise coupling branch comprising specified delays, wherein feedback of the noise coupling branch is applied to the input of the quantizer; and a resonator path feeding back resonator path quantization noise to the quantizer. In another embodiment, the specified delays comprise a first-order delay and a second-order delay; wherein the noise coupling branch multiplies delayed quantization noise, wherein the first-order delay comprises a first-order noise coupling branch delay coefficient and the second-order delay comprises a second-order noise coupling branch delay coefficient; and wherein the resonator path multiplies delayed resonator path quantization noise, the resonator path comprising first-order resonator path delay, wherein the first-order resonant path delay comprises a first-order resonant path delay coefficient. For another embodiment, the first-order noise coupling branch delay coefficient equals minus two, and the second-order noise coupling branch delay coefficient equals plus one. In yet another embodiment, the resonator path is merged into the noise coupling branch by summing the first-order noise coupling branch delay coefficient with the first-order resonator path delay coefficient. A further embodiment further comprises a summing element generating a quantization noise signal, wherein the summing element combines an input signal and an output signal from the quantizer. Other embodiments further comprise a first-order delay element for adding first-order delay to the quantization noise signal; a second-order delay element for adding second-order delay to the quantization noise signal; a first feedback stage for feeding back a first order delay element output signal from the first order delay element, which is multiplied by a first order delay element coefficient, to input of the quantizer; a second feedback stage for feeding back a second order delay element output signal from the second order delay element to input of the quantizer; and a third feedback stage for feeding back output signal from the first order delay element, which is multiplied by a third feedback stage coefficient, to input of the quantizer. Another embodiment comprises an analog circuit for processing an input signal to the quantizer; and a digital circuit for processing an output signal from the quantizer. A following embodiment comprises separated analog and digital noise coupling branches. A subsequent embodiment comprises branch matching by digital subtraction before active adder input. For one embodiment, the analog circuit comprises a first first-order delay element and a second first-order delay element adding analog first order delay to the input signal to the quantizer; a first second-order delay element for adding analog second order delay to the input signal to the quantizer; a first feedback stage, a second feedback stage and a third feedback stage for feeding back output signals from the first first-order delay element, the second first-order delay element and the first second-order delay element, respectively, each of which is multiplied by a specified coefficient, to the input of the quantizer; wherein the digital circuit comprises; a third first-order delay element adding digital first-order delay to the output signal from the quantizer; a second second-order delay element adding digital second-order delay to the output signal from the quantizer; and a fourth feedback stage and a fifth feedback stage for feeding back input signals from the third first-order delay element and the second second-order element, respectively, each of which is multiplied by a respective specified coefficient. In additional embodiments, the analog circuit comprises a first-order integrator located at a stage previous to the input signal to the quantizer; a first first-order delay element adding first-order delay to the input signal to the quantizer; a first second-order delay element adding second-order delay to the input signal to the quantizer; a first feedback stage and a second feedback stage feeding back output signals from the first first-order delay element and the first second-order delay element, respectively, each of which is multiplied by a first first-order delay element coefficient and a first second-order delay element coefficient, respectively, to the input of the first-order integrator; wherein the digital circuit comprises a second first-order delay element adding digital first-order delay to the output signal from the quantizer; a third feedback stage feeding back an output signal from the second first-order delay element which is multiplied by a second first-order delay element coefficient, to the input of the first-order integrator; a third first-order element adding digital third first-order delay to the output signal from the quantizer; a fourth first-order element adding digital fourth first-order delay to the output signal from the quantizer summed with output signal from the third first-order element; and a fourth feedback stage feeding back output signal from the fourth first-order element, which is multiplied by a fourth first-order element coefficient, to the first-order integrator. For other embodiments, the first first-order delay element coefficient is equal to the second first-order element coefficient. For yet other embodiments, the first first-order delay element coefficient and the second first-order delay element coefficient are formed by the same capacitance. More embodiments provide an analog to digital convertor comprising the previous modulator systems. Another embodiment provides a digital to analog convertor comprising the previous modulator systems.

An embodiment includes a method for modulation comprising receiving an input signal and a first feedback signal; integrating the input signal and the first feedback signal in an integrator; summing at least the integrated signal with the input signal producing a summed signal; quantizing the summed signal in a quantizer, producing a quantized signal; feeding back the quantized signal as the first feedback signal; feeding back quantization noise between the quantizer and the integrator through a noise coupling branch, wherein the noise coupling branch comprises specified delays; and feeding back the quantization noise between the quantizer and the integrator through a resonator path. In a subsequent embodiment, the specified delays comprise a first-order delay and a second-order delay; further comprising the steps of multiplying, in the noise coupling branch, delayed quantization noise, wherein the first-order delay comprises a first-order noise coupling branch delay coefficient and the second-order delay comprises a second-order noise coupling branch delay coefficient; and multiplying, in the resonator path, delayed resonator path quantization noise, the resonator path comprising first-order resonator path delay, wherein the first-order resonant path delay comprises a first-order resonant path delay coefficient. For other embodiments, the resonator path is merged into the noise coupling branch by summing the first-order noise coupling branch delay coefficient with the first-order resonator path delay coefficient. An added embodiment further comprises the steps of providing an analog circuit for processing an input signal to the quantizer; providing a digital circuit for processing an output signal from the quantizer; adding, in a first first-order delay element and a second first-order delay element, analog first order delay to the input signal to the quantizer; adding, in a first second-order delay element, analog second order delay to the input signal to the quantizer; feeding back, through an analog first feedback stage, an analog second feedback stage and an analog third feedback stage, output signals from the first first-order delay element, the second first-order delay element and the first second-order delay element, respectively, each of which is multiplied by a respective specified coefficient, to the input of the quantizer; adding, in a third first-order delay element, digital first-order delay to the output signal from the quantizer; adding, in a second second-order delay element, digital second-order delay to the output signal from the quantizer; and feeding back, through a digital fourth feedback stage and a digital fifth feedback stage, output signals from the third first-order delay element and the second second-order delay element, respectively, each of which is multiplied by a respective specified coefficient.

An embodiment includes a method for modulation comprising receiving an input signal and a quantizer output first feedback signal; integrating the input signal and the quantizer output first feedback signal in an integrator, producing an integrated signal; providing an analog circuit for processing a quantizer input signal to the quantizer; providing a digital circuit for processing an output signal from the quantizer; providing a first-order integrator located at a stage previous to the quantizer input signal to the quantizer; adding, in a first first-order delay element, analog first-order delay to the quantizer input signal to the quantizer; adding, in a first second-order delay element, analog second-order delay to the quantizer input signal to the quantizer; feeding back, through an analog first feedback stage and an analog second feedback stage, output signals from the first first-order delay element and the first second-order delay element, respectively, each of which is multiplied by a first first-order delay element coefficient and a first second-order delay element coefficient, respectively, to the input of the first-order integrator; adding, in a second first-order delay element, digital first-order delay to the output signal from the quantizer; feeding back, through a digital third feedback stage, an output signal from the second first-order delay element which is multiplied by a second first-order delay element coefficient, to the input of the first-order integrator; adding, in a third first-order element, digital third first-order delay to the output signal from the quantizer; adding, in a fourth first-order element, digital fourth first-order delay to the output signal from the quantizer summed with output signal from the third first-order element; and feeding back, through a digital a fourth feedback stage, output signal from the fourth first-order element, which is multiplied by a fourth first-order element coefficient, to the first-order integrator.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The following detailed description provides example embodiments of the presently claimed invention with references to the accompanying drawings. The description is intended to be illustrative and not limiting the scope of the present invention. Embodiments are described in sufficient detail to enable one of ordinary skill in the art to practice the subject invention. Other embodiments may be practiced with some variations without departing from the spirit or scope of the subject invention.

Zero Optimization

Figure 2:
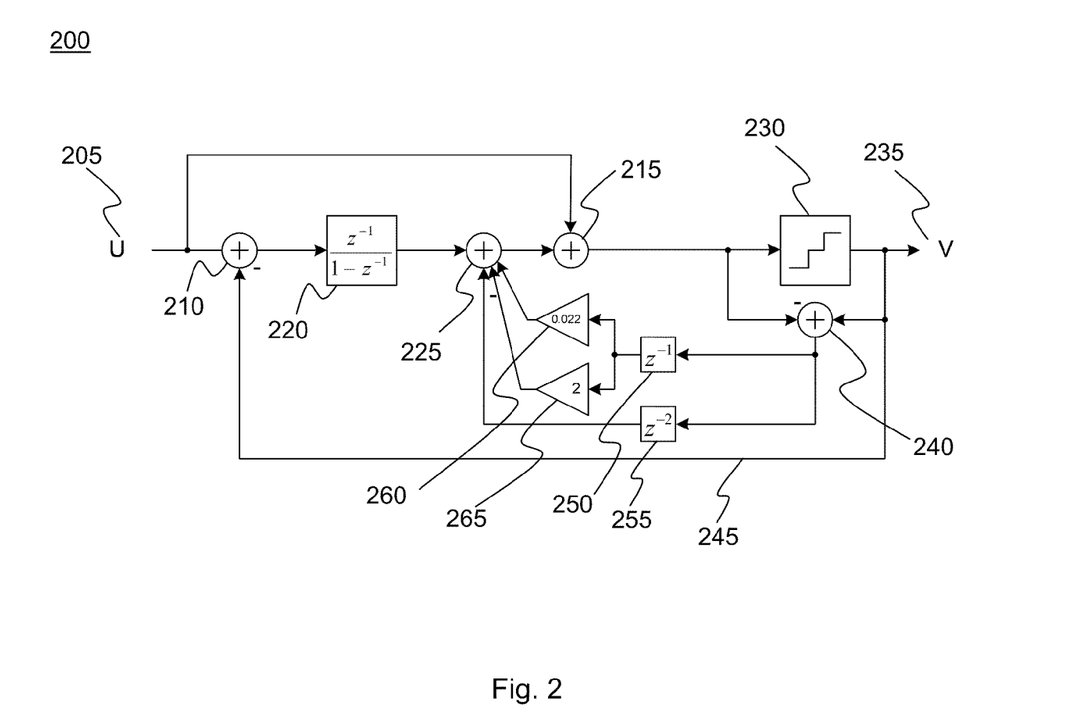
FIG. 2 is a block diagram of a third-order modulator with second-order noise coupling and zero optimization in noise coupling branches configured in accordance with one embodiment of the present invention.

FIG. 2 is a block diagram 200 of a third-order modulator with second-order noise coupling and zero optimization in noise coupling branches for one embodiment. Input U 205 is applied to summing nodes 210 and 215. Output of summing node 210 is applied to input of integrator 220. Output of integrator 220 is applied to summing node 225. Output of summing node 225 is applied to summing node 215. Output of summing node 215 is applied to quantizer 230 which provides output V 235, and is also applied to summing node 240. Output of quantizer 230 is also applied to summing node 210 via feedback path 245. Output of summing node 240 is applied to delay element 250 and delay element 255. Output of delay element 255 is applied to summing node 225. Output of delay element 250 is applied through feedback stage 260 and feedback stage 265. Output of each of feedback stage 260 and feedback stage 265 is applied to summing node 225. The coefficients of feedback stage 260 and feedback stage 265 are 0.022 and 2, respectively. This block diagram depicts use of a low-distortion modulator with second-order noise coupling to build a third-order modulator loop, moving the branch used for zero optimization into the noise coupling. It has an OSR of 16. On the summing node 240, the input signal for the quantizer 230 is subtracted from the output of the quantizer 230. Then the output of summing node 240 provides the quantization noise itself. The main noise coupling branches realize the transfer function $(-2z^{-1}+z^{-2})$, and they couple the quantization noise to the input of active adder 225. This results in second-order-shaped quantization noise. The feedback stage 260 works as the resonator path with a small coefficient of 0.022, realizes the transfer function (+0.022$z^{-1}$), and also couples the quantization noise to the input of the active adder 225. This resonator path comprising 260 put in parallel with the noise-coupling branches (comprising 255 and 265) realizes zero-optimization in the second-order-shaped quantization noise of the main noise coupling branches. The noise transfer function (NTF) of FIG. 2 is:

$$(V(z)/E(z)) = (1-z^{-1})(1-2z^{-1}+0.022z^{-1}+z^{-2}) \quad (1).$$

Figure 3:
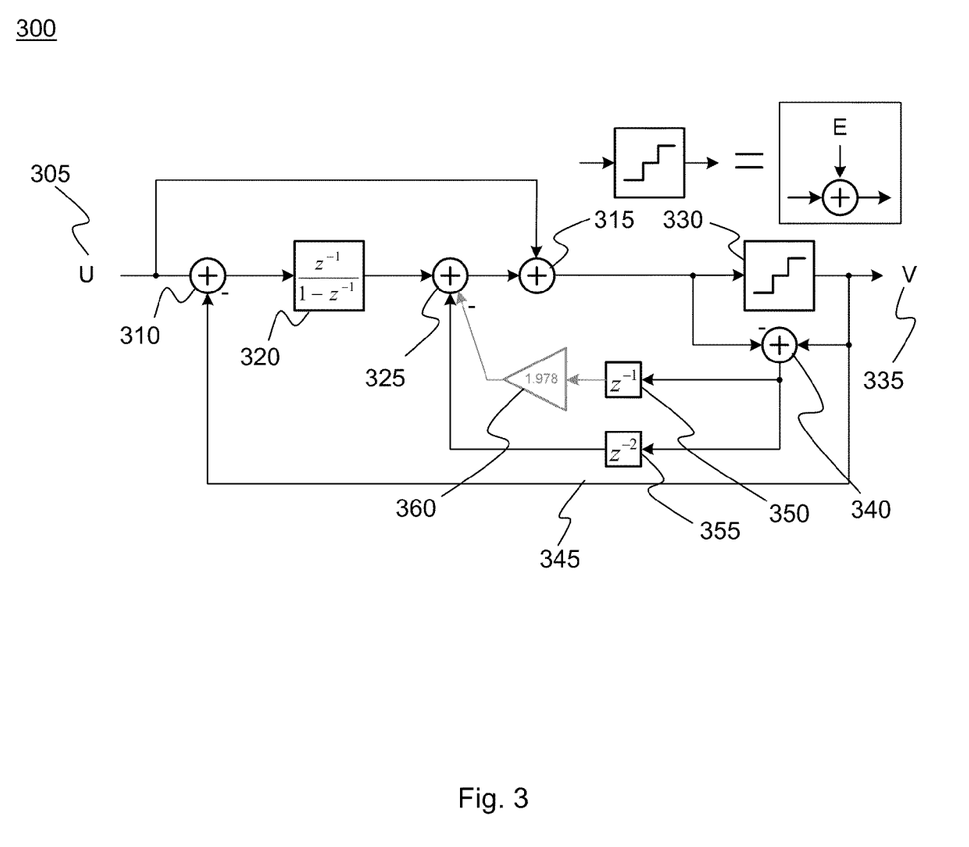
FIG. 3 is a block diagram of a third-order modulator of FIG. 2 with merged coefficients configured in accordance with one embodiment of the present invention.

FIG. 3 is a block diagram of a third-order modulator 300 with merged coefficients of FIG. 2 in accordance with an embodiment. Similar to FIG. 2's block diagram, input U 305 is applied to summing nodes 310 and 315. Output of summing node 310 is applied to input of integrator 320. Output of integrator 320 is applied to summing node 325. Output of summing node 325 is applied to summing node 315. Output of summing node 315 is applied to quantizer 330 which provides output V 335, and is also applied to summing node 340. Output of quantizer 330 is also applied to summing node 310 via feedback path 345. Output of summing node 340 is applied to delay element 350 and delay element 355. Output of delay element 355 is applied to summing node 325. Output of delay element 350 is applied through feedback stage 360. Output from feedback stage 360 is negatively applied to summing node 325. A distinction is that the resonator coefficient path is in parallel with the feedback branches in FIG. 2, and is merged on FIG. 3. Now the coefficient is not small, even for very high OSR values. The noise transfer function (NTF) of FIG. 3 is:

$$\frac{V(z)}{E(z)} = (1-z^{-1})(1-1.978z^{-1}+z^{-2}). \quad (2)$$

The right side first factor term (1–$z^{-1}$) comes from the modulator loop without noise coupling. The second-order term moves the zero from DC to the optimal frequency, obtained by noise coupling. This zero optimization can be applied for higher-order noise coupling by placing several zeros in the same way as otherwise in zero optimization.

Branch Optimization

Figure 4:
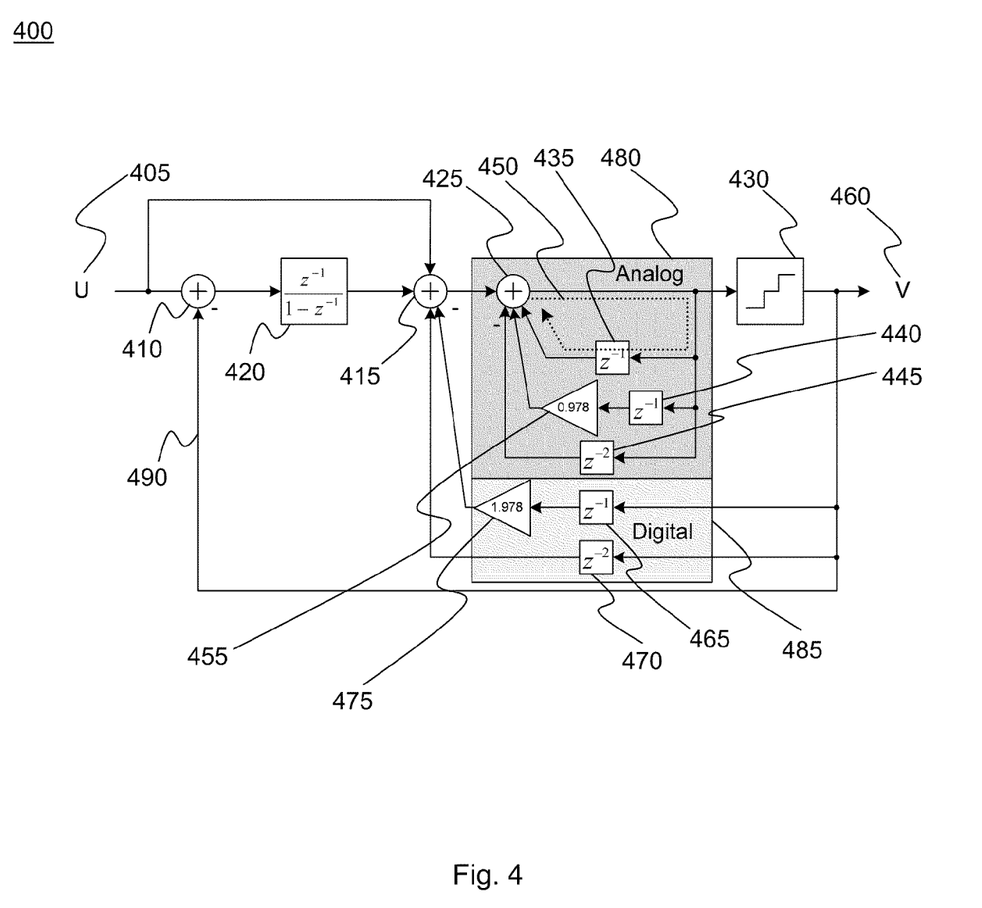
FIG. 4 is a block diagram depicting separated analog and digital noise coupling branches configured in accordance with one embodiment of the present invention.

FIG. 4 is a block diagram of a modulator 400 depicting separated analog and digital noise coupling branches in one embodiment. Input U 405 is applied to summing nodes 410 and 415. Output of summing node 410 is applied to input of integrator 420. Output of integrator 420 is applied to summing node 415. Output of summing node 415 is applied to summing node 425 of analog section. Output of summing node 425 is applied to quantizer 430 as well as delay elements 435, 440, and 445. The path from summing node 425 through delay element 435, returning to summing node 425, forms loop 450. Output of delay element 445 is negatively applied to summing node 425. Output of delay element 440 is applied through feedback stage 455. Output from feedback stage 455 is also applied to summing node 425. Quantizer 430 provides output V 460, and is also applied to delay elements 465 and 470 of digital section. Output of quantizer 430 is also applied to summing node 410 via feedback path 490. Output of delay element 470 is applied to summing node 415. Output of delay element 465 is applied through feedback stage 475. Output from feedback stage 475 is also negatively applied to summing node 415. Analog section 480 comprises components 425, 435, 440, 445, and 455. Digital section 485 comprises components 465, 470, and 475. By modifying the noise coupling branches of FIG. 3, the feedback factor of active adder 425 is increased. From this, power consumption is reduced. FIG. 4 shows separation of the analog 480 and digital 485 paths of noise coupling branches at the adder. This separation results in different signs for analog and digital paths to provide delayed quantization noises. One of the $z^{-1}$ branches of the analog paths can be used to form an integrator. However, then the coefficients of branches are not matched between analog and digital paths. To match the number of branches, a digital subtraction is done at the input of the delay block before the active adder input.

Figure 5:
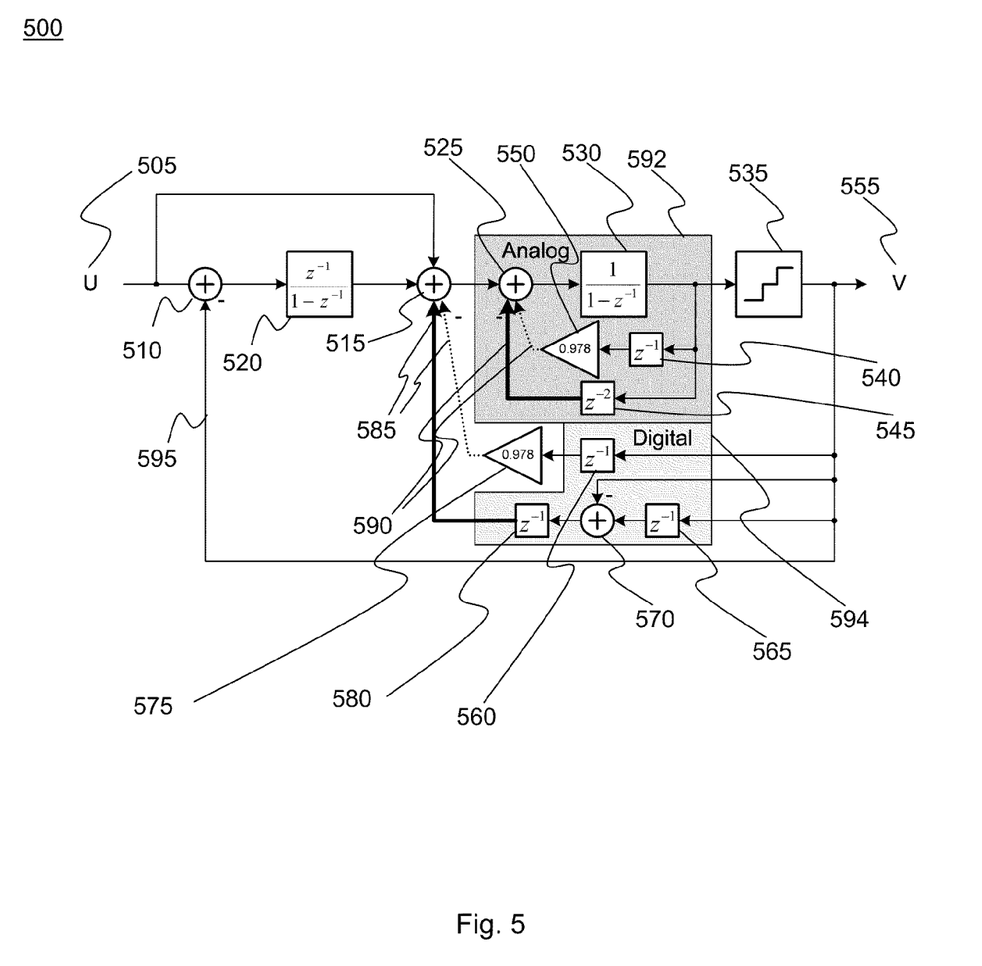
FIG. 5 is a block diagram depicting branch matching by digital subtraction before active adder input configured in accordance with one embodiment of the present invention.

FIG. 5 depicts the resulting structure. FIG. 5 is a block diagram of a modulator 500 depicting branch matching by digital subtraction before active adder input for an embodiment of the invention. Input U 505 is applied to summing nodes 510 and 515. Output of summing node 510 is applied to input of integrator 520. Output of integrator 520 is applied to summing node 515. Output of summing node 515 is applied to summing node 525 of analog section. Output of summing node 525 is applied to integrator 530. Output of integrator 530 is applied to quantizer 535 as well as delay elements 540 and 545. Output of delay element 540 is applied through feedback stage 550. Output from feedback stage 550 is applied to summing node 525. Output of delay element 545 is also negatively applied to summing node 525. Quantizer 535 provides output V 555, and is also applied to delay elements 560 and 565, and negatively to summing node 570 of digital section. Output of 535 is also negatively applied to 510 by path 595. Output of delay element 560 is applied through feedback stage 575. Output from feedback stage 575 is negatively applied to summing node 515. Output of summing node 570 is applied to delay element 580. Output of delay element 580 is applied to summing node 515. Delay element 565 output is applied to summing node 570. Analog section 592 comprises components 525, 530, 540, 545, and 550. Digital section 594 comprises components 560, 565, 570, and 580. When the circuit is designed, the feedback factor of the second integrator 530 can be increased by sharing capacitors, realizing the dashed-line and solid-line digital 585 and analog 590 branches. Hence, the power consumption can be reduced. In addition, major power savings come from reducing the number of amplifiers with the noise coupling approach. In FIG. 5, two op-amps are eliminated, compared with the modulator of FIG. 1, including the op-amp of the active adder required for a multi-bit quantizer structure.

Figure 6:
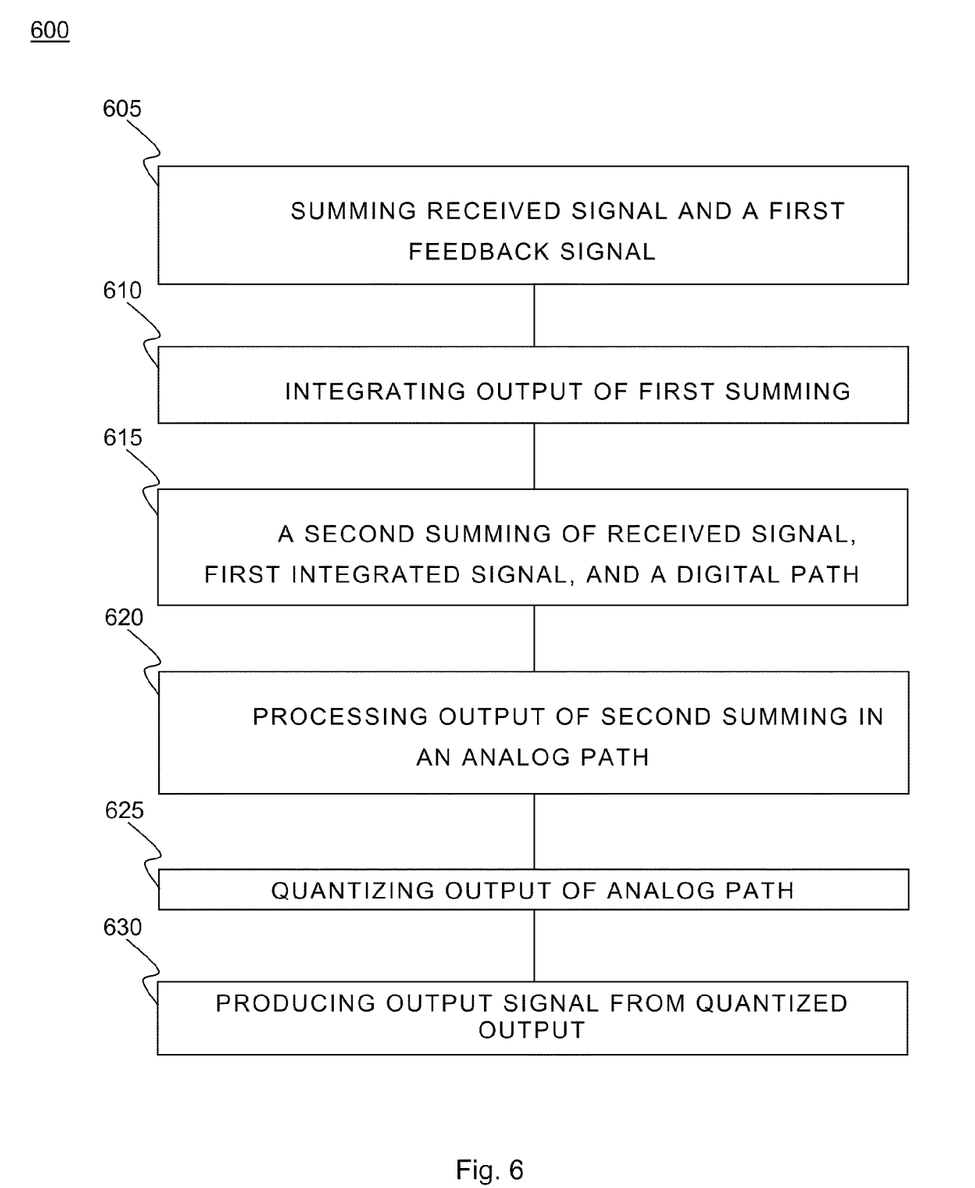
FIG. 6 is a flow chart of a method for performing a delta sigma conversion in accordance with one embodiment of the present invention.

FIG. 6 is a flow chart 600 of a method for performing a delta sigma conversion. It comprises the steps of a first summing of a received signal and a first feedback signal 605; a first integrating 610 of the output of the first summing, producing a first integrated signal; a second summing 615 of the received signal, the first integrated signal, and a digital path signal; processing output of the second summing in an analog path 620, the analog path comprising feedback; and quantizing 625 output of the analog path, wherein output of the quantizing is applied to the digital path, the digital feedback path comprising feedback, wherein output of the quantizing is the first feedback signal, and providing output signal 630 from quantized output.

Figure 7:
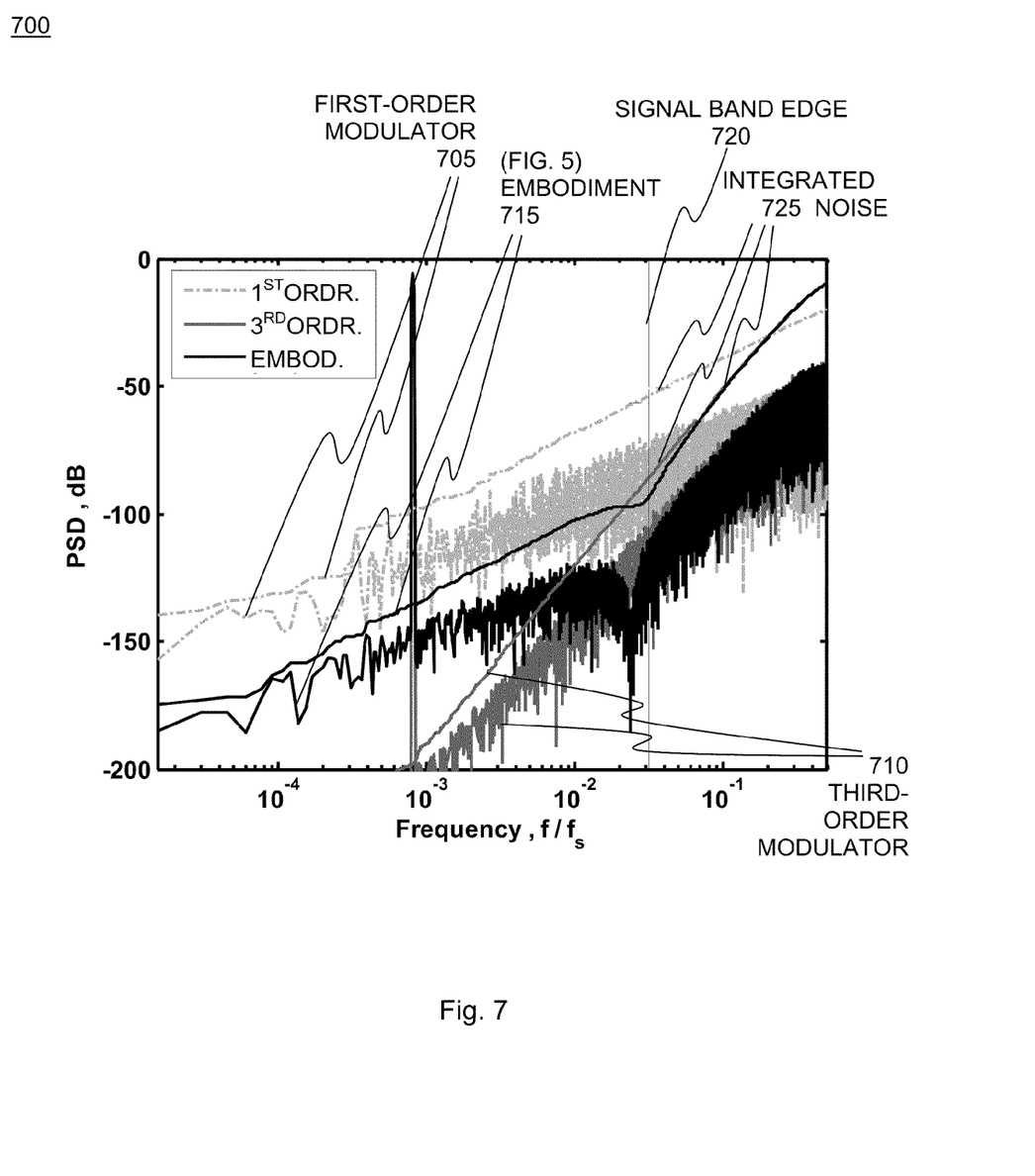
FIG. 7 depicts a power spectral density (PSD) simulation result for an embodiment of the present invention.

FIG. 7 depicts a power spectral density (PSD) simulation result 700 for an embodiment of the present invention. First-order and third-order modulators were simulated using MATLAB®, with a –6 dB input sine wave, an OSR of 16, and a 15-level quantizer. In the fast Fourier Transform (FFT), 65,536 data points were used. Particularly, FIG. 7 shows the power spectral densities of a first-order modulator 705, a third-order modulator without zero optimization 710 (as from the third-order modulator architecture of FIG. 1 less summing node 130 and feedback path 150), and PSD 715 of the modulator embodiment shown in FIG. 5 to illustrate the effects of noise coupling and zero optimization. Signal band edge 720 and integrated noise 725 are also shown. By using the invention's noise coupling and zero optimization, a second-order NTF enhancement and 7.6 dB SQNR improvement are achieved.

Zero optimization techniques are disclosed for noise-coupled modulators. They apply to low power systems, eliminating very small capacitors and gain factors, reducing the number of op-amps, and increasing the feedback factors in addition to reducing chip area.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A modulator system comprising:
   an integrator receiving an input signal summed with a first feedback signal;
   a quantizer receiving said input signal summed with an integrator output signal from said integrator, said quantizer outputting said first feedback signal to input of said integrator;
   a noise coupling branch feeding back a quantization noise between input and output of said quantizer, said noise coupling branch comprising specified delays, wherein feedback of said noise coupling branch is applied to said input of said quantizer; and
   a resonator path feeding back resonator path quantization noise to said quantizer;
   wherein said specified delays comprise a first-order delay and a second-order delay;
   wherein said noise coupling branch multiplies delayed quantization noise, wherein said first-order delay comprises a first-order noise coupling branch delay coefficient and said second-order delay comprises a second-order noise coupling branch delay coefficient; and
   wherein said resonator path multiplies delayed resonator path quantization noise, said resonator path comprising first-order resonator path delay, wherein said first-order resonant path delay comprises a first-order resonant path delay coefficient.

2. The modulator system according to claim 1, wherein said first-order noise coupling branch delay coefficient equals minus 2, and said second-order noise coupling branch delay coefficient equals plus 1.

3. The modulator system according to claim 1, wherein said resonator path is merged into said noise coupling branch by summing said first-order noise coupling branch delay coefficient with said first-order resonator path delay coefficient.

4. The modulator system according to claim 1, further comprising:
   a summing element generating a quantization noise signal, wherein said summing element combines an input signal and an output signal from said quantizer.

5. A modulator system comprising:
   an integrator receiving an input signal summed with a first feedback signal;
   a quantizer receiving said input signal summed with an integrator output signal from said integrator, said quantizer outputting said first feedback signal to input of said integrator;
   a noise coupling branch feeding back a quantization noise between input and output of said quantizer, said noise coupling branch comprising specified delays, wherein feedback of said noise coupling branch is applied to said input of said quantizer; and
   a resonator path feeding back resonator path quantization noise to said quantizer;
   a summing element generating a quantization noise signal, wherein said summing element combines an input signal and an output signal from said quantizer;
   a first-order delay element for adding first-order delay to said quantization noise signal;
   a second-order delay element for adding second-order delay to said quantization noise signal;
   a first feedback stage for feeding back a first order delay element output signal from said first order delay element, which is multiplied by a first order delay element coefficient, to input of said quantizer;
   a second feedback stage for feeding back a second order delay element output signal from said second order delay element to input of said quantizer; and
   a third feedback stage for feeding back output signal from said first order delay element, which is multiplied by a third feedback stage coefficient, to input of said quantizer.

6. The modulator system according to claim 1, comprising:
   an analog circuit for processing an input signal to said quantizer; and
   a digital circuit for processing an output signal from said quantizer.

7. The modulator system according to claim 6, comprising separated analog and digital noise coupling branches.

8. The modulator system according to claim 6, comprising branch matching by digital subtraction before active adder input.

9. A modulator system comprising:
   an integrator receiving an input signal summed with a first feedback signal;
   a quantizer receiving said input signal summed with an integrator output signal from said integrator, said quantizer outputting said first feedback signal to input of said integrator;
   a noise coupling branch feeding back a quantization noise between input and output of said quantizer, said noise coupling branch comprising specified delays, wherein feedback of said noise coupling branch is applied to said input of said quantizer; and
   a resonator path feeding back resonator path quantization noise to said quantizer;
   an analog circuit for processing an input signal to said quantizer; and
   a digital circuit for processing an output signal from said quantizer;
   wherein said analog circuit comprises;
   a first first-order delay element and a second first-order delay element adding analog first order delay to said input signal to said quantizer;
   a first second-order delay element for adding analog second order delay to said input signal to said quantizer;
   a first feedback stage, a second feedback stage and a third feedback stage for feeding back output signals from said first first-order delay element, said second first-order delay element and said first second-order delay element, respectively, each of which is multiplied by a specified coefficient, to said input of said quantizer;
wherein said digital circuit comprises;
a third first-order delay element adding digital first-order delay to said output signal from said quantizer;
a second second-order delay element adding digital second-order delay to said output signal from said quantizer; and
a fourth feedback stage and a fifth feedback stage for feeding back input signals from said third first-order delay element and said second second-order element, respectively, each of which is multiplied by a respective specified coefficient.

10. A modulator system comprising:
an integrator receiving an input signal summed with a first feedback signal;
a quantizer receiving said input signal summed with an integrator output signal from said integrator, said quantizer outputting said first feedback signal to input of said integrator;
a noise coupling branch feeding back a quantization noise between input and output of said quantizer, said noise coupling branch comprising specified delays, wherein feedback of said noise coupling branch is applied to said input of said quantizer; and
a resonator path feeding back resonator path quantization noise to said quantizer;
an analog circuit for processing an input signal to said quantizer; and
a digital circuit for processing an output signal from said quantizer;
wherein said analog circuit comprises:
a first-order integrator located at a stage previous to said input signal to said quantizer;
a first first-order delay element adding first-order delay to said input signal to said quantizer;
a first second-order delay element adding second-order delay to said input signal to said quantizer;
a first feedback stage and a second feedback stage feeding back output signals from said first first-order delay element and said first second-order delay element, respectively, each of which is multiplied by a first first-order delay element coefficient and a first second-order delay element coefficient, respectively, to said input of said first-order integrator;
wherein said digital circuit comprises:
a second first-order delay element adding digital first-order delay to said output signal from said quantizer;
a third feedback stage feeding back an output signal from said second first-order delay element which is multiplied by a second first-order delay element coefficient, to said input of said first-order integrator;
a third first-order element adding digital third first-order delay to said output signal from said quantizer;
a fourth first-order element adding digital fourth first-order delay to said output signal from said quantizer summed with output signal from said third first-order element; and
a fourth feedback stage feeding back output signal from said fourth first-order element, which is multiplied by a fourth first-order element coefficient, to said first-order integrator.

11. The modulator system according to claim 10, wherein said first first-order delay element coefficient is equal to said second first-order element coefficient.

12. The modulator system according to claim 11, wherein said first first-order delay element coefficient and said second first-order element coefficient are formed by same capacitance.

13. An analog to digital convertor comprising said modulator system of claim 1.

14. A digital to analog convertor comprising said modulator system of claim 1.

15. A method for modulation comprising:
receiving an input signal and a first feedback signal;
integrating said input signal and said first feedback signal in an integrator;
summing at least said integrated signal with said input signal producing a summed signal;
quantizing said summed signal in a quantizer, producing a quantized signal;
feeding back said quantized signal as said first feedback signal;
feeding back quantization noise between said quantizer and said integrator through a noise coupling branch, wherein said noise coupling branch comprises specified delays;
feeding back said quantization noise between said quantizer and said integrator through a resonator path;
wherein said specified delays comprise a first-order delay and a second-order delay; further comprising the steps of:
multiplying, in said noise coupling branch, delayed quantization noise, wherein said first-order delay comprises a first-order noise coupling branch delay coefficient and said second-order delay comprises a second-order noise coupling branch delay coefficient; and
multiplying, in said resonator path, delayed resonator path quantization noise, said resonator path comprising first-order resonator path delay, wherein said first-order resonant path delay comprises a first-order resonant path delay coefficient.

16. The method according to claim 15, wherein said resonator path is merged into said noise coupling branch by summing said first-order noise coupling branch delay coefficient with said first-order resonator path delay coefficient.

17. A method for modulation comprising:
receiving an input signal and a first feedback signal;
integrating said input signal and said first feedback signal in an integrator;
summing at least said integrated signal with said input signal producing a summed signal;
quantizing said summed signal in a quantizer, producing a quantized signal;
feeding back said quantized signal as said first feedback signal;
feeding back quantization noise between said quantizer and said integrator through a noise coupling branch, wherein said noise coupling branch comprises specified delays;
feeding back said quantization noise between said quantizer and said integrator through a resonator path;
providing an analog circuit for processing an input signal to said quantizer;
providing a digital circuit for processing an output signal from said quantizer;
adding, in a first first-order delay element and a second first-order delay element, analog first order delay to said input signal to said quantizer;
adding, in a first second-order delay element, analog second order delay to said input signal to said quantizer;

feeding back, through an analog first feedback stage, an analog second feedback stage and an analog third feedback stage, output signals from said first first-order delay element, said second first-order delay element and said first second-order delay element, respectively, each of which is multiplied by a respective specified coefficient, to said input of said quantizer;

adding, in a third first-order delay element, digital first-order delay to said output signal from said quantizer;

adding, in a second second-order delay element, digital second-order delay to said output signal from said quantizer; and feeding back, through a digital fourth feedback stage and a digital fifth feedback stage, output signals from said third first-order delay element and said second second-order delay element, respectively, each of which is multiplied by a respective specified coefficient.

18. A method for modulation comprising:

receiving an input signal and a quantizer output first feedback signal;

integrating said input signal and said quantizer output first feedback signal in an integrator, producing an integrated signal;

providing an analog circuit for processing a quantizer input signal to said quantizer;

providing a digital circuit for processing an output signal from said quantizer;

providing a first-order integrator located at a stage previous to said quantizer input signal to said quantizer;

adding, in a first first-order delay element, analog first-order delay to said quantizer input signal to said quantizer;

adding, in a first second-order delay element, analog second-order delay to said quantizer input signal to said quantizer;

feeding back, through an analog first feedback stage and an analog second feedback stage, output signals from said first first-order delay element and said first second-order delay element, respectively, each of which is multiplied by a first first-order delay element coefficient and a first second-order delay element coefficient, respectively, to said input of said first-order integrator;

adding, in a second first-order delay element, digital first-order delay to said output signal from said quantizer;

feeding back, through a digital third feedback stage, an output signal from said second first-order delay element which is multiplied by a second first-order delay element coefficient, to said input of said first-order integrator;

adding, in a third first-order element, digital third first-order delay to said output signal from said quantizer;

adding, in a fourth first-order element, digital fourth first-order delay to said output signal from said quantizer summed with output signal from said third first-order element; and feeding back, through a digital a fourth feedback stage, output signal from said fourth first-order element, which is multiplied by a fourth first-order element coefficient, to said first-order integrator.

* * * * *